(12) United States Patent
Yasuda et al.

(10) Patent No.: US 9,641,931 B2
(45) Date of Patent: May 2, 2017

(54) DRIVE CIRCUIT

(71) Applicant: Trigence Semiconductor, Inc., Tokyo (JP)

(72) Inventors: Akira Yasuda, Tokyo (JP); Jun-ichi Okamura, Tokyo (JP)

(73) Assignee: Trigence Semiconductor, Inc., Tokyo (JP)

( * ) Notice: Subject to any disclaimer, the term of this patent is extended or adjusted under 35 U.S.C. 154(b) by 368 days.

(21) Appl. No.: 14/178,656

(22) Filed: Feb. 12, 2014

(65) Prior Publication Data

US 2014/0169577 A1 Jun. 19, 2014

Related U.S. Application Data

(63) Continuation of application No. PCT/JP2012/070373, filed on Aug. 9, 2012.

(30) Foreign Application Priority Data

Aug. 12, 2011 (JP) .................................. 2011-176648

(51) Int. Cl.
*H04R 3/00* (2006.01)
*H04R 1/00* (2006.01)
(Continued)

(52) U.S. Cl.
CPC ............... *H04R 3/00* (2013.01); *H03F 3/217* (2013.01); *H03M 7/14* (2013.01); *H03M 7/165* (2013.01);
(Continued)

(58) Field of Classification Search
None
See application file for complete search history.

(56) References Cited

U.S. PATENT DOCUMENTS 5,117,234 A * 5/1992 Shizawa ............. H03M 7/3004
341/143
2007/0210861 A1 9/2007 Chen
(Continued)

FOREIGN PATENT DOCUMENTS

CN 101034875 A 9/2007
CN 101114835 A 1/2008
(Continued)

OTHER PUBLICATIONS

Okamura et al. English translation of "Digital Speaker Driving Device." WO2009154067. pp. 1-20. Dec. 23, 2009.*
(Continued)

*Primary Examiner* — Curtis Kuntz
*Assistant Examiner* — Qin Zhu
(74) *Attorney, Agent, or Firm* — Typha IP LLC

(57) ABSTRACT

As one embodiment a drive circuit is disclosed. When a three-value signal including a value representing zero is input, the drive circuit outputs two two-value signals that drive two drive elements such that the difference between values representing the two two-value signals corresponds to a value representing the input three-value signal. When the value of the input three-value signal represents zero, output signals are determined in accordance with the input history of the three-value signal. The drive circuit may also be provided with a memory that records a flag value that is reversed in accordance with the input history of the input three-value signal, and the combination of the output two two-value signals being determined in accordance with the flag.

6 Claims, 14 Drawing Sheets

Decision Logic Algorithm

(51) Int. Cl.
*H03M 7/14* (2006.01)
*H03M 7/16* (2006.01)
*H03F 3/217* (2006.01)

(52) U.S. Cl.
CPC ..... *H04R 1/005* (2013.01); *H03K 2217/0045* (2013.01)

(56) References Cited

U.S. PATENT DOCUMENTS

2008/0052593 A1 2/2008 Lee et al.
2011/0050467 A1 3/2011 Crespi et al.
2011/0169679 A1 7/2011 Teramoto et al.

FOREIGN PATENT DOCUMENTS

| | | |
|---|---|---|
| CN | 201018655 Y | 2/2008 |
| CN | 101542909 A | 9/2009 |
| WO | 2010/061513 A1 | 6/2010 |

OTHER PUBLICATIONS

Chinese Office Action mailed on May 3, 2016 for corresponding Chinese Patent Application No. 201280039476.5.

\* cited by examiner

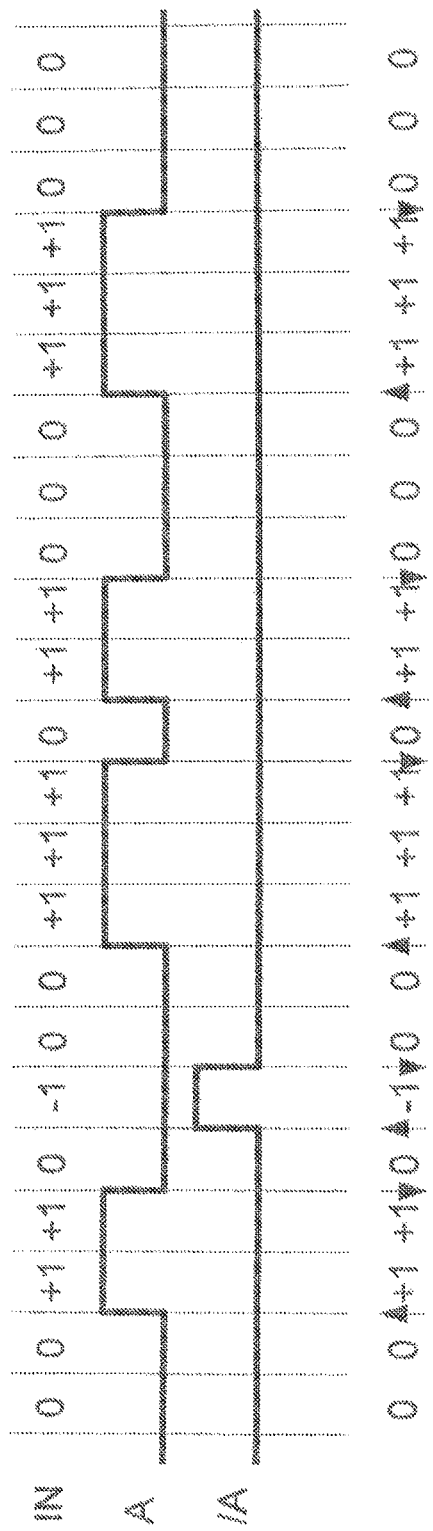

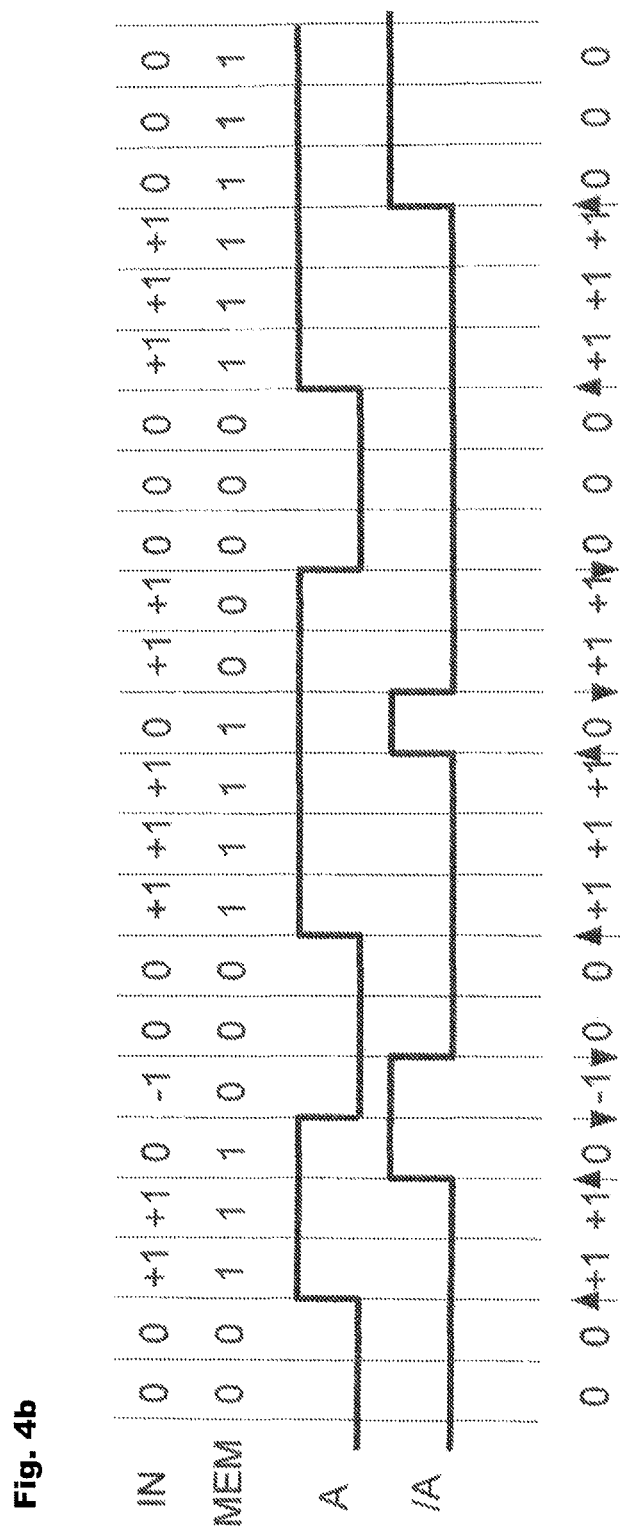

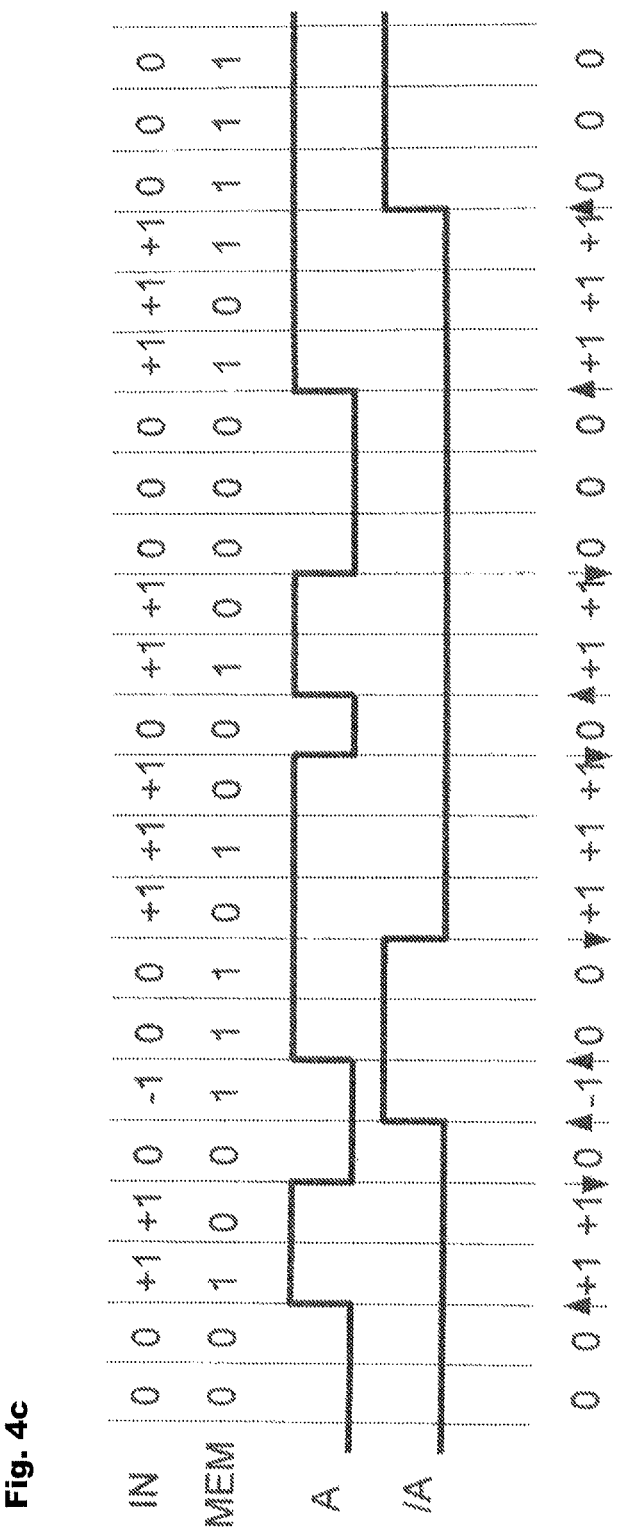

DRIVE CIRCUIT

CROSS REFERENCE TO RELATED APPLICATIONS

This application is a U.S. continuation application filed under 35 U.S.C. §111 (a), of International application No. PCT/JP2012/070373, filed on Aug. 9, 2012, which claims priority to Japanese Patent Application No. 2011-176648, filed on Aug. 12, 2011, the disclosure of which are incorporated by reference.

BACKGROUND

Technical Field

The present invention is related to a drive circuit for driving a drive element using a three-value signal. In particular, the present invention can be suitably used for a digital sound system an application of the digital sound system, in which a digital speaker apparatus directly converting a digital signal into analog sound and a drive circuit for driving the digital speaker using a three-value signal are used.

Description of Related Art

WO2007/135928A1 is proposed as a digital-analog conversion device which directly converts a digital signal into analog audio. A system for directly converting a digital signal into analog sound using a circuit which is input with a digital sound signal and outputs a plurality of digital signals and a plurality of coils (unit) which are driven by the plurality digital signals is referred to below as a digital sound system as proposed in WO2007/135928A1.

Such a digital sound system can output a large sound pressure at a low voltage compared to an analog sound system which uses a conventional single speaker or single drive since it uses a plurality of speakers or a plurality of drive units (coils etc), in addition to features such as low system power consumption compared to an analog sound system which drives a speaker using an analog electrical signal.

The digital sound system proposed in WO2007/135928A1 is comprised from a circuit which outputs a plurality of digital signals using a ΔΣ modulator and a mismatch shaping filter circuit, and a digital speaker device which directly converts analog sound by driving a plurality of coils (unit) which are driven by the plurality of digital signals.

FIG. 1 shows a conventional example of a digital speaker device comprised from a circuit which outputs a plurality of digital signals using a ΔΣ modulator and a post-filter circuit, and a plurality of speaker driving elements. A 1 bit digital input signal (101) is input to a ΔΣ modulator (102) and is converted to a plurality of digital signals (103) having n bits by the ΔΣ modulator (102). The plurality of digital signals having n bits are converted to a thermometer code (105) having m bits by a formatter circuit (104) and, following this, are converted to k number of digital signals (107), which are mismatch shaped by the post-filter (106). S number of speaker drive circuits (108) are controlled by the three values of 0, +1, and −1 in response to a digital selection signal.

A conventional example of a drive circuit which drives a driving element using the three values of 0, +1, and −1 in response to a digital selection signal is shown in Japanese Patent Laid Open 2010-028783.

In the digital sound system proposed in WO2007/135928A1, the post-filter removes a noise caused by manufacturing variation of a plurality of coils, the noise being a problem when driving a plurality of coils (units), by using a mismatch shaping method.

As described above, it is demanded that a digital sound system is drives a driving element using the three values of 0, +1, and −1 in response to a digital selection signal. While it is possible to remove the characteristic variation of each of a plurality of driving elements by a mismatch shaping method using a post-filter in the same manner as manufacturing variation between coils (units), there is a problem whereby a noise caused by variation that depends on the transition direction of a driving element which drives a signal with the three values of 0, +1, and −1 cannot be removed.

SUMMARY

As described above, in the case of constructing a digital sound system using a digital audio system comprised from a plurality of coils which are driven by a plurality of digital signals generated from a digital audio signal, there is a problem whereby a noise caused by variation in pulse widths depending on the transition direction of a driving element cannot be suppressed particularly in the case when controlling using the three values of 0, +1, and −1 in response to a digital selection signal of a plurality of drive elements. In order to avoid variation between signals having the three values of 0, +1, and −1, it is necessary to devise a method which does not invite an increase in circuit scale at the same time as making the area of each signal pulse being the same.

The present invention provides a mechanism for making the variation in pulse width between signals having the three values of 0, +1, and −1 being uniform by making variation of pulse widths depending on the transition direction of the driving element constant in a digital sound system for driving a plurality of driving elements using the three values of 0, +1, and −1 in response to a digital selection signal.

As one embodiment of the present invention, provided is a drive circuit to which a three-value signal including a value representing 0 is input, and which outputs two two-value signals for driving two drive elements such that a difference between the values representing the two two-value signals corresponds to a value representing the three-value signal, which is input, the drive circuit determining a combination of the two two-value signals, which are output, according to an input history of the three-value signal, which is input, in the case where the value of the three-value signal, which is input, represents 0.

As one embodiment of the present invention, provided is an operation method of a drive circuit including inputting a three-value signal including a value representing 0, and outputting two two-value signals for driving two drive elements such that a difference between the values representing the two two-value signals corresponds to a value representing the three-value signal, the drive circuit determining a combination of the two two-value signals, which are output, according to an input history of the three-value signal, which is input, in the case where the value of the three-value signal, which is input, represents 0.

BRIEF EXPLANATION OF THE DRAWINGS

FIG. 4a is an example diagram of a conventional driving operation waveform of a drive circuit of a digital sound system for driving a plurality of driving elements by the three values of 0, +1, and −1 in response to a digital selection signal;

FIG. 4b is an example diagram of a driving operation waveform of a drive circuit of a digital sound system for driving a plurality of driving elements by the three values of 0, +1, and −1 in response to a digital selection signal of the first embodiment of the present invention;

FIG. 4c is another example diagram of a driving operation waveform of a drive circuit of a digital sound system for driving a plurality of driving elements by the three values of 0, +1, and, −1 in response to a digital selection signal of the first embodiment of the present invention;

DESCRIPTION OF EMBODIMENTS

Embodiments for realizing the present invention are explained below as a plurality of examples. Furthermore, the present invention is not limited to these embodiments. The present invention can be implemented by adding various modifications to these embodiments.

Figure 1:
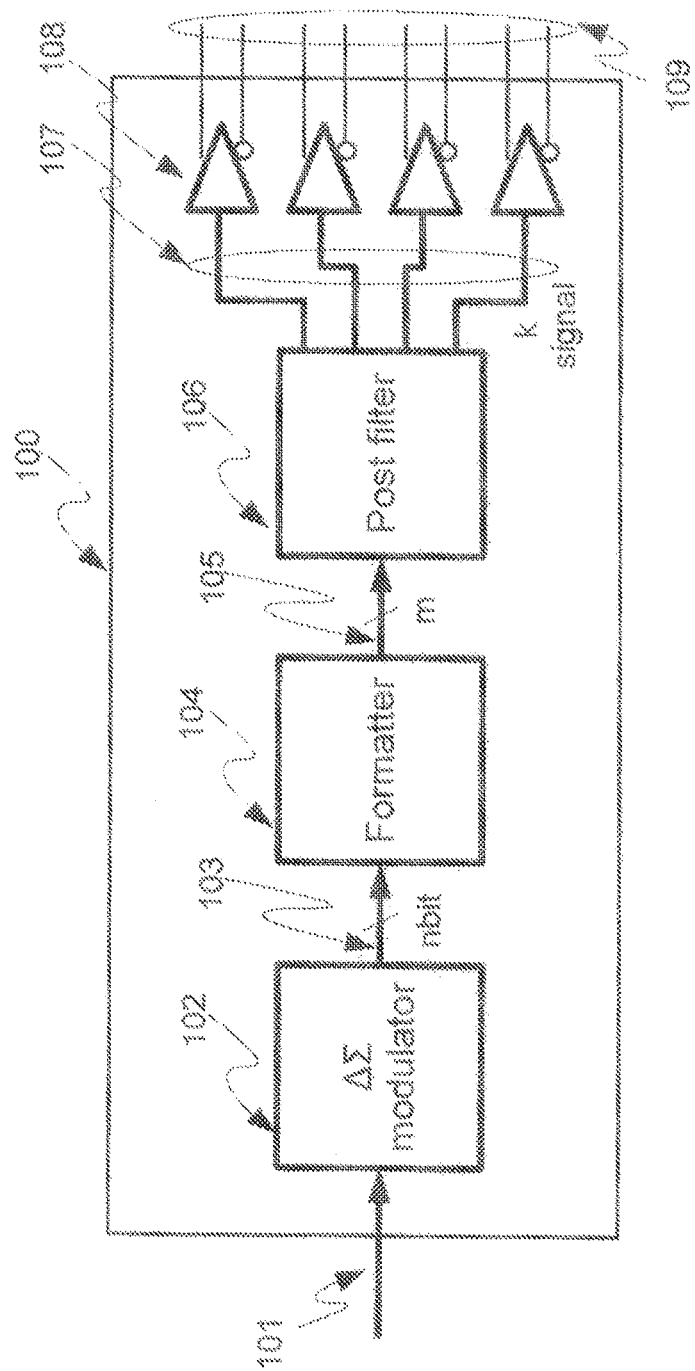
FIG. 1 is an example diagram of a conventional drive circuit in a digital sound system for driving a plurality of driving elements by the three values of 0, +1, and −1 in response to a digital selection signal.
Figure 2:
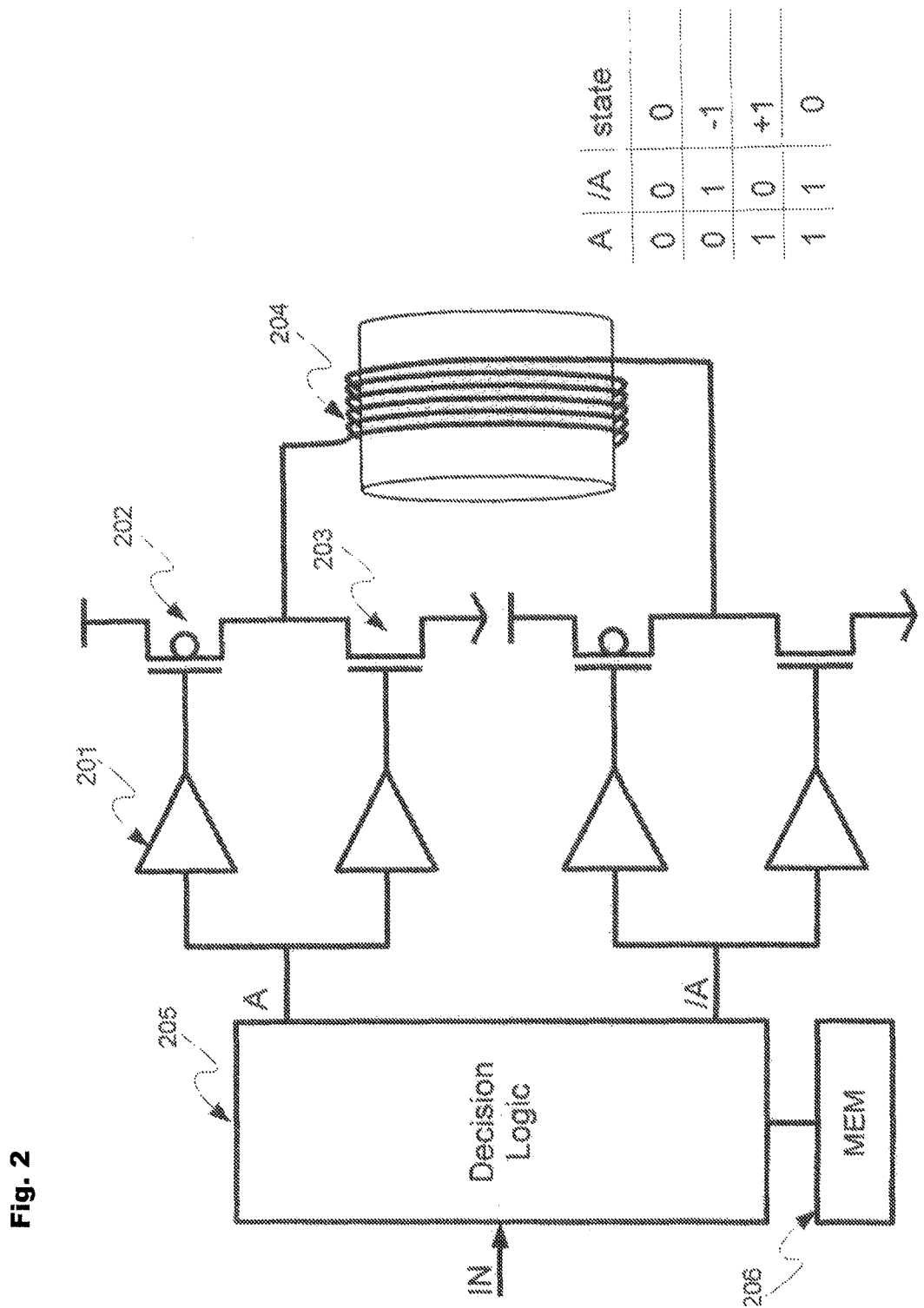
FIG. 2 is a structural diagram of a drive circuit of a digital sound system for driving a plurality of driving elements by the three values of 0, +1, and −1 in response to a digital selection signal in a first embodiment of the present invention.

FIG. 2 shows a circuit structure of the first embodiment of the present invention. Drive circuits (201) and pairs of a source side drive transistor (202) and a sink side drive transistor (203), which are driven by a drive circuit (201), are bridge connected via a load coil (204). In addition, a logic circuit (205) and a memory (206) are connected before the drive circuit for driving with the three values of 0, +1, and −1. In this way, a combination of two driving signals (A and /A) are modulated to the drive circuit, which is bridge connected, according to a history of three-value signals being input to the logic circuit (205). In particular, two combinations {0, 0} and {1, 1} are mutually output in time series as the two drive signals (A and /A) when the input signal represents 0.

Below, a three-value signal is assumed to be a combination of the values of 0, +1, and −1. Furthermore, 0, +1, and +1 are exemplified, and any arbitrary combination of values is possible. In addition, while a driving signal is a combination of the values of 0 and 1, an arbitrary combination of any values is possible, similarly to the three-value signal.

In particular, it is possible to make a difference between two two-value signals corresponds to a three-value signal if three-value signals are represented with 0, +1, and −1 and if two-value signals are represented by 0 and 1. That is, 0−0=0, 1−1=0, 1−0=+1, and 0−1=−1.

Figure 3:
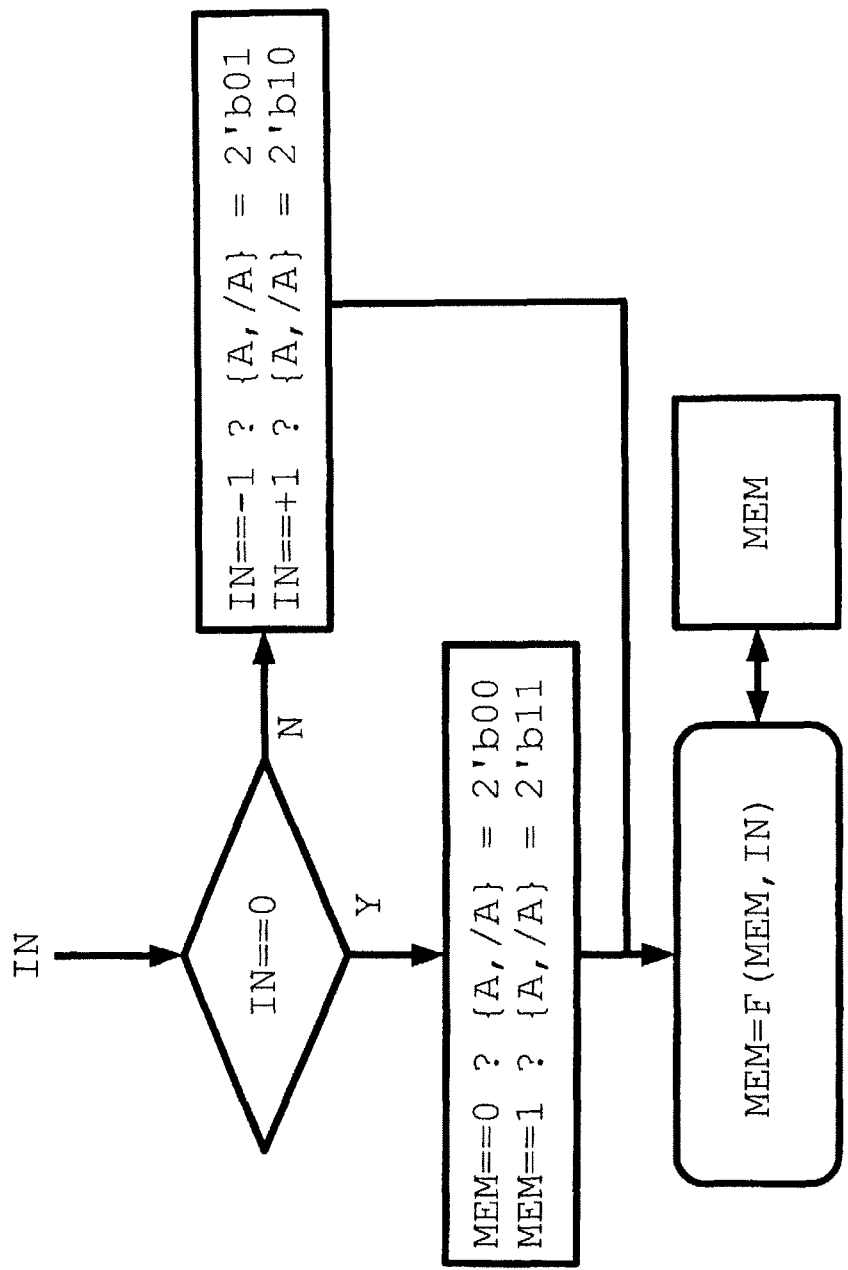
FIG. 3 is a flowchart for explaining the operation of a logic circuit for a drive circuit in a digital sound system of the first embodiment of the present invention.

FIG. 3 shows a flowchart of an algorithm executed by the logic circuit (205) shown in FIG. 2 related to the first embodiment of the present invention. In the present embodiment, in the case where a signal (IN) being input is +1 or −1, an output with respect to two drive signals (A and /A) is given as {1,0} and {0,1} respectively. In this way, 1−0=+1 and 0−1=−1. In addition, a value of a flag (a flag value) stored in a memory is inverted. For example, if the present flag value is 0, the next flag value is 1, and if the present flag value is 1, the next flag value is 0. In the case where a signal (IN) being input is 0, depending on the flag value stored in the memory with respect to two drive signals (A and /A), two types of combinations {0,0} and {1,1} are output. In this way, 0−0=0 and 1−1=0.

FIG. 4a shows a conventional example of a signal waveform of a drive circuit for driving using the three values of 0, +1, and −1 in response to a digital selection signal. In the case where a signal (IN) being input is +1 or −1, {1,0} and {0,1} are output to the two drive signals (A and /A) respectively, and in the case where a signal (IN) being input is 0, {0,0} is usually output as the two drive signals (A and /A).

FIG. 4b shows a first example of a signal waveform of a drive circuit for driving by the three values of 0, +1, and −1 in response to a digital selection signal. In the case where a signal (IN) being input is +1 or −1, {1,0} and {0,1} are output as the two drive signals (A and /A) respectively, and in the case where a signal (IN) being input is 0, {0,0} or {1,1} are output as the two drive signals (A and /A).

As an example shown by FIG. 4b, in the case where a signal (IN) being input is +1 or −1, and in the case where the previous signal (IN) being input is 0, the flag value being stored by the memory is inverted as in the flow chart shown in FIG. 3. In the case where a signal (IN) being input is 0, two types of combinations of {0, 0} and {1, 1} are output according to the flag value being stored in the memory with respect to the two drive signals (A and /A).

FIG. 4c shows another signal waveform of the first example of a drive circuit for driving by the three values of 0, +1, and −1 in response to a digital selection signal. In the case where a signal (IN) being input is +1 or −1, {1,0} and {0,1} are output as the two drive signals (A and /A) respectively, and in the case where a signal (IN) being input is 0, {0,0} or {1,1} are output as the two drive signals (A and /A).

As an example shown by FIG. 4c, in the flow chart shown in FIG. 3, the flag value being stored in the memory is inverted in the case where a signal (IN) being input is +1 or −1. In the case where the signal (IN) being input is 0, two types of combinations of {0, 0} and {1, 1} are output according to the flag value being stored in the memory with respect to the two drive signals (A and /A).

Figure 4D:
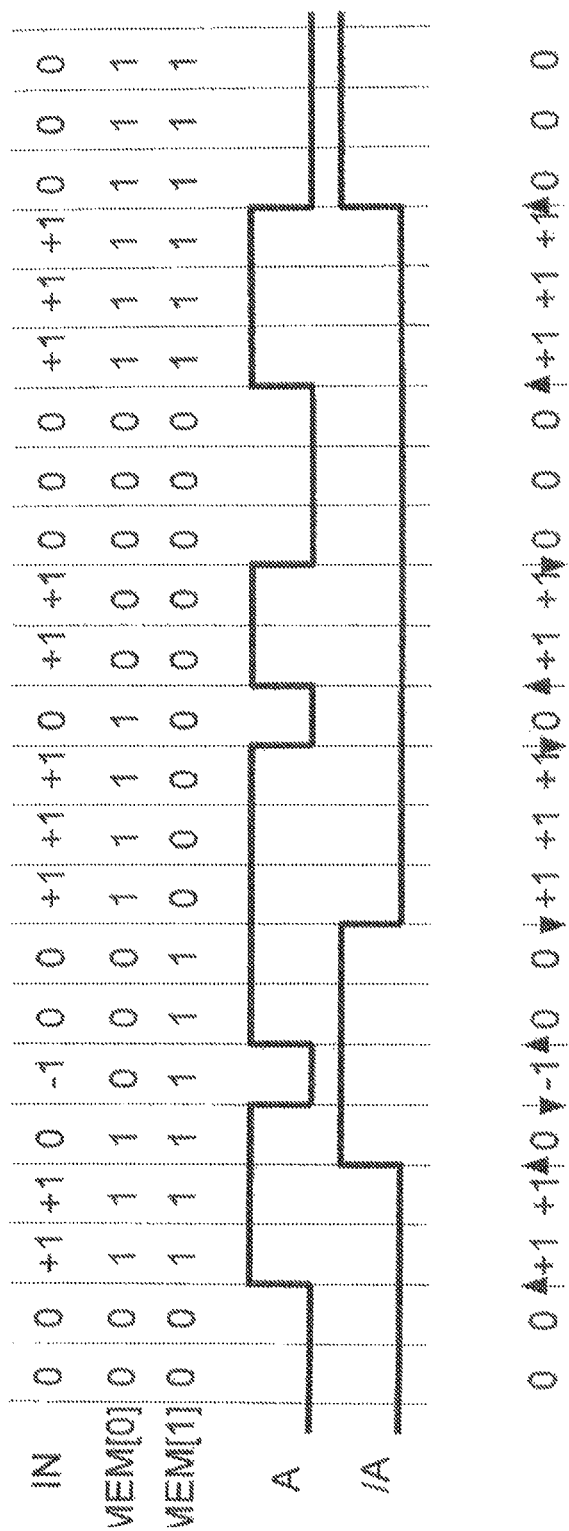
FIG. 4d is another an example diagram of a driving operation waveform of a drive circuit of a digital sound system for driving a plurality of driving elements by the three values of 0, +1, and −1 in response to a digital selection signal of the first embodiment of the present invention.

As an example shown by FIG. 4d, in the flowchart shown in FIG. 3, in the case where the signal (IN) being input is +1 or −1, and in the case where the previous signal (IN) being input is 0, the flag value stored in memory[0] is inverted, and at the same time the flag value stored in memory[1] is inverted according to the content of memory[0]. In the case of where the signal (IN) being input is 0, two types of combinations of {0, 0} and {1, 1} are output according to a flag value being stored in memory[1] with respect to two drive signals (A and /A).

According to the present invention, by connecting a logic circuit and a memory before a drive circuit for driving by the three values of 0, +1, and −1 as shown in FIG. 2, a combination of two drive signals (A and /A) are modulated to the drive circuit, which is bridge connected, according to the history of the three value signals of 0, +1, and −1 being input to the logic circuit. In this way, it is possible to mutually use two types of combinations of {0, 0} and {1, 1} in time series as the two drive signals (A and /A) when the signal being input is 0.

Figure 5A:
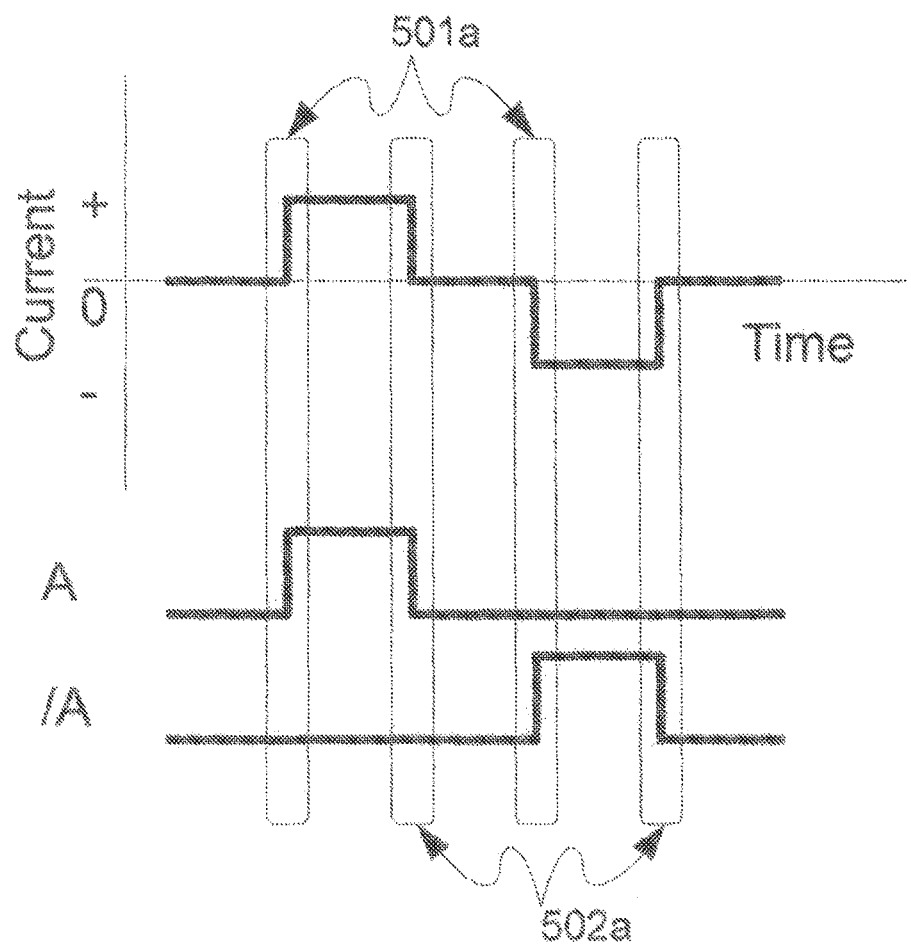
FIG. 5a is an example diagram of a conventional driving operation waveform and a driving current waveform of a drive circuit of a digital sound system for driving a plurality of driving elements by the three values of 0, +1, and −1 in response to a digital selection signal.

FIG. 5a shows a conventional example of input signal waveform and current flowing to a coil being driven by a drive circuit for driving by the three values of 0, +1, and −1 in response to a digital selection signal. In the case where a signal (IN) being input is +1 or −1, {1,0} and {0,1} are respectively output as the two driving signals (A and /A), and in the case where the signal (IN) being input is 0, {0,0} is usually output as the two driving signals (A and /A). The current which flows to the coil being driven is +1, 0, or −1, depending on whether the signal (IN) being input is +1, 0 or −1.

In the conventional example shown in FIG. 5a, two drive signals (A and /A) are usually changed from 0 to 1 at a transition timing (501a) for changing the current flowing to a coil being driven from 0 to +1 or −1. Similarly, two drive signals (A and /A) are usually changed from 1 to 0 at a transition timing (502a) for changing the current flowing to a coil being driven from +1 to −1 or 0.

In this way, the drive circuit performs the same switching operation at the transition timing (501a) when a current begins to flow to a coil being driven, and a transition timing (502a) when a current finishes flowing to the coil being driven. As a result, for example, when the characteristics of a drive transistor being driven by the two drive signals (A and /A) are different in the case where the drive signals (A and /A) transit from 0 to 1, and in the case where the drive signals (A and /A) transit from 1 to 0, a problem is produced whereby a pulse width of the current which flows to the coil being driven is differently modulated from an ideal pulse width.

Figure 5B:
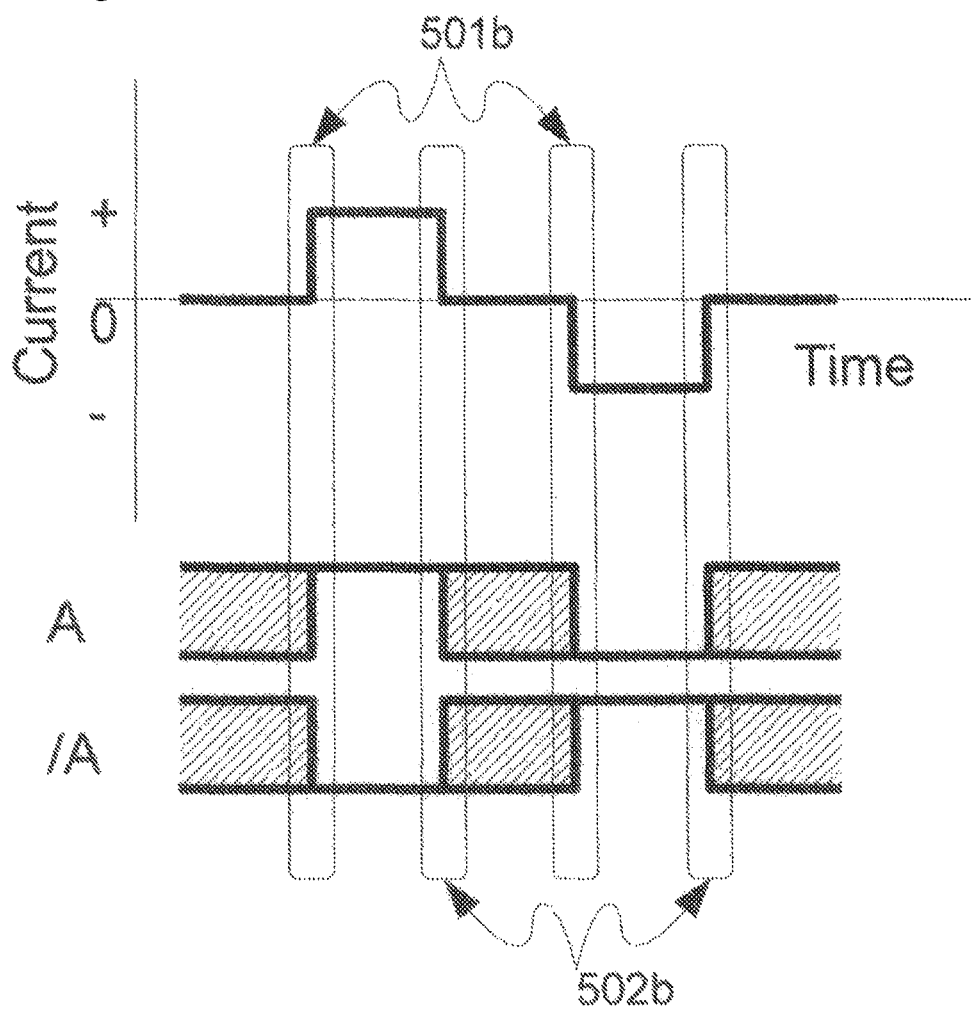
FIG. 5b is a driving operation waveform and a driving current waveform of a drive circuit of a digital sound system for driving a plurality of driving elements by the three values of 0, +1, and −1 in response to a digital selection signal according to the first embodiment of the present invention.

On the other hand, FIG. 5b shows an input signal waveform and a current flowing to a coil being driven in an embodiment of the present invention of the drive circuit for driving by the three values of 0, +1, and −1 in response to a digital selection signal. In the case where a signal (IN) being input is +1 or −1, {1,0} and {0,1} are respectively output as the two driving signals (A and /A), and in the case where a signal (IN) being input is 0, {0,0} or {1,1} are alternately output as the two drive signals (A and /A). At this time, a current flowing to the coil being driven becomes +1, 0, or −1 depending on whether a signal (IN) being input is +1, 0, or −1.

In the embodiments of the present application shown in FIG. 5b, an operation of two drive signals (A and /A) at a transition timing (502a) for changing a current flowing to a coil being driven from 0 to +1 or from 0 to −1 arises in both the case of changing from 0 to 1 and in the case of changing from 1 to 0. Similarly, an operation of two drive signals (A/A) at a transition timing (502b) for changing a current flowing to a coil to be driven from +1 to 0 or from −1 to 0 also arises in both the case of changing from 0 to 1 and in the case of changing from 1 to 0.

In this way, since a switching operation of the drive circuit at the transition timing (501b) when a current begins to flow to a coil being driven and the transition timing (502b) when a current finishes flowing to a coil being driven are not fixed, even if the characteristics of a drive transistor being driven by the two drive signals (A and /A) are different in the case where the drive signals (A and /A) transit from 0 to 1, and in the case where the drive signals (A and /A) transit from 1 to 0, variation of the current flow to the coil being driven is homogenized.

Figure 6:
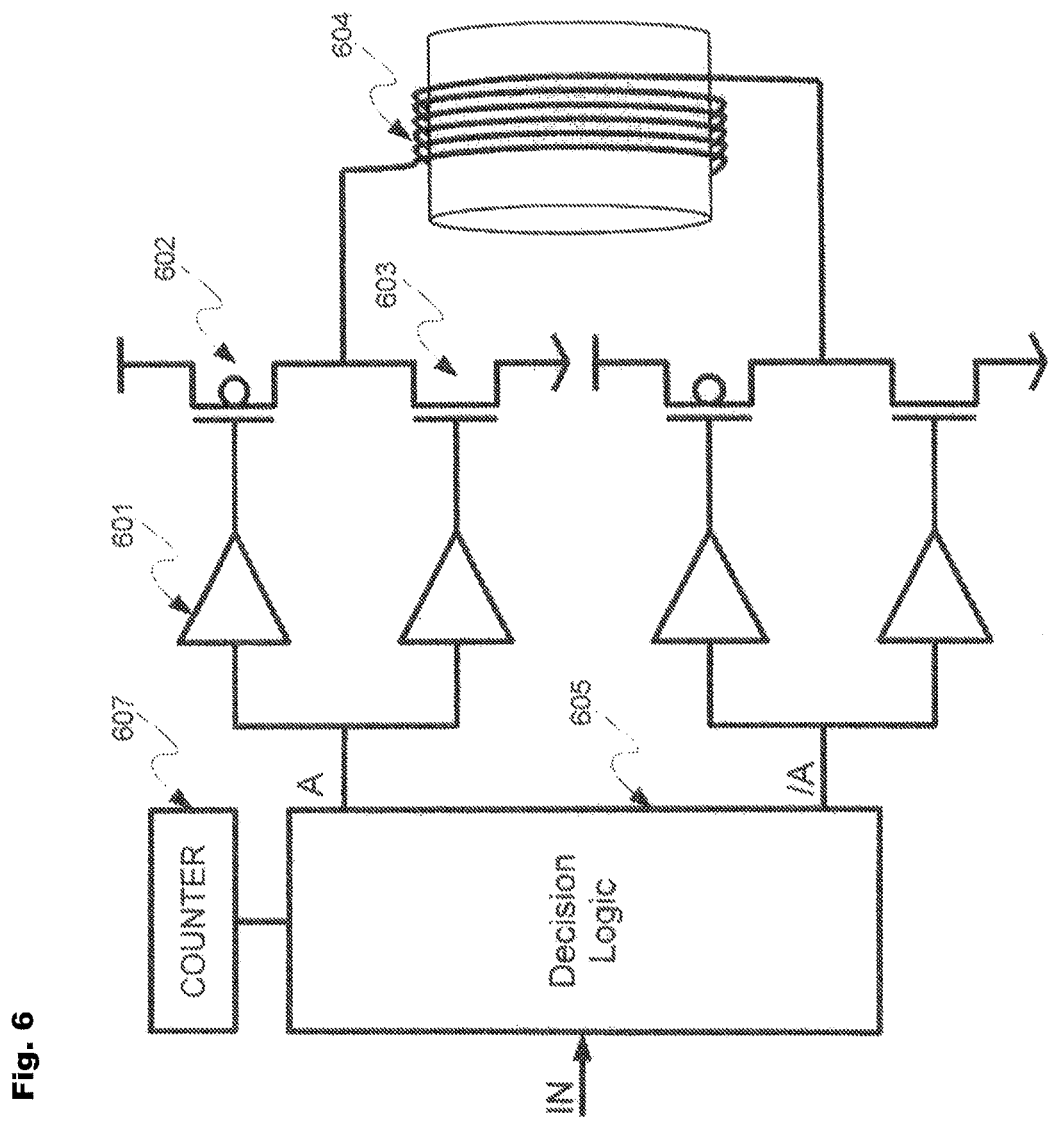
FIG. 6 is a structural diagram of a drive circuit of a digital sound system for driving a plurality of driving elements by the three values of 0, +1, and −1 in response to a digital selection signal of a second embodiment of the present invention.

FIG. 6 shows a second embodiment of the present invention. Drive circuits (601) and pairs of a source side drive transistor (602) and a sink side drive transistor (603) which are driven by a drive circuit (601) are bridge connected via a load coil (604). A logic circuit (605) and a counter (607) for counting a frequency of the combinations {0,0} and {1,1} of outputs of the drive signals (A and /A) when an input signal is 0, are connected before the drive circuit for driving with the three values of 0, +1, and −1. A combination of two driving signals (A and /A) are modulated to the drive circuit, which are bridge connected, according a three-value signal of 0, +1, and −1 being input to the logic circuit (605) and a value of the counter. In addition, as described in the first embodiment, it is possible to modulate a combination of the drive signals (A and /A) by using a memory and also by referencing the state of the memory. In particular, two types of combinations of {0,0} and {1,1} are mutually output in time series as the two drive signals (A and /A) when the input signal is 0.

Figure 7:
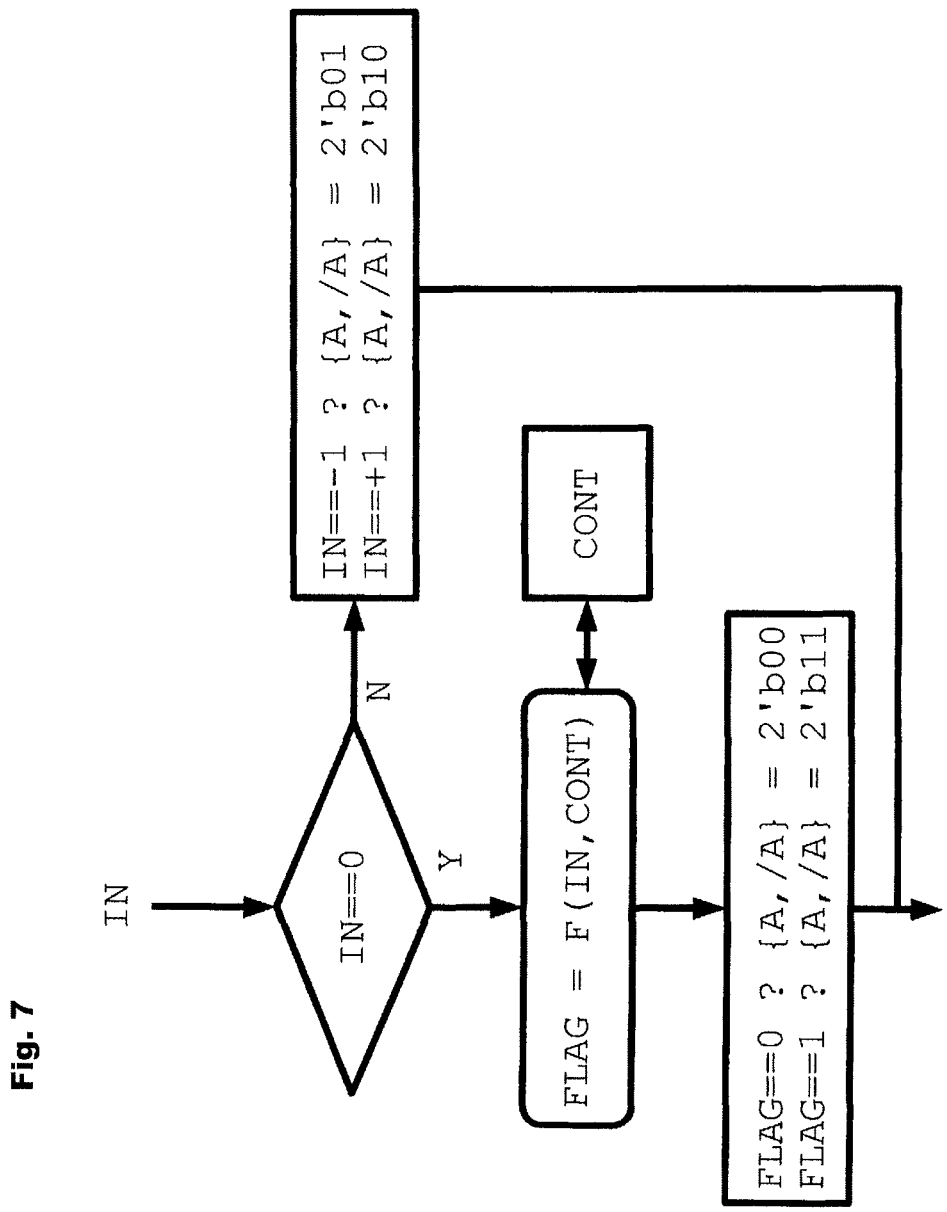
FIG. 7 is a flowchart for explaining the operation of a logic circuit for a drive circuit of a digital sound system of the second embodiment of the present invention.

FIG. 7 is an explanation related to an algorithm executed by the logic circuit (605) shown in FIG. 6 in the second embodiment of the present invention. In the present embodiment, in the case where a signal (IN) being input is +1 or −1, two drive signals (A and /A) are output as {1, 0} and {0, 1} respectively. In the case where a signal (IN) being input is 0, a value selected from two types of combinations of {0, 0} and {1, 1} is output and the counter is refreshed according to the value of the counter which counts the two types of combinations of {0, 0} and {1, 1} of the two drive signals (A and /A).

According to the second embodiment, since a switching operation of the drive circuit at the transition timing when a current begins to flow to a coil being driven and at the transition timing when a current finishes flowing to a coil being driven is not fixed, even if the characteristics of a drive transistor being driven by the two drive signals (A /A) are different in the case where the drive signals (A and /A) transit from 0 to 1, and in the case where the drive signals (A and /A) transit from 1 to 0, variation of the current flowing to the coil being driven is homogenized. Furthermore, because the two types of combinations of {0, 0} and {1, 1} of drive signals (A and /A) in the case where a signal (IN) being input is 0 becomes homogenized, any variation in transition from a state (+1 or −1) where current is flown to a coil to a state where a current is not flown to a coil is also homogenized.

In the second embodiment, in order to homogenize the two types of combinations of {0,0} and {1,1} of drive signals (A and /A) in the case where a signal (IN) being input is 0, a counter for counting the two types of combinations of {0,0} and {1,1} of drive signals (A and /A) is arranged, however, it is possible to replaces the counter with an integrating circuit for integrating the frequency of occurrence of the two types of combinations of {0,0} and {1,1}.

When a drive signal is represented by a two-value, 0 is represented by time series of {0, 1} or {1, 0}, +1 is represented by {1, 1}, and −1 is represented by {0, 0}. Since the number of transitions are the same for both combinations of {0, 1} and {1, 0} which represent 0, and since a linearity of the expression from −1 to +1 is guaranteed, it is easy to balance the transition timing when a current begins to flow to a coil, the transition timing when a current finishes flowing to a coil to be driven, and a switching operation of the drive circuit. However when representing 0, because a switching operation always arises, there is a problem whereby in applications for driving a speaker, current consumption increases when a signal is small.

Figure 8:
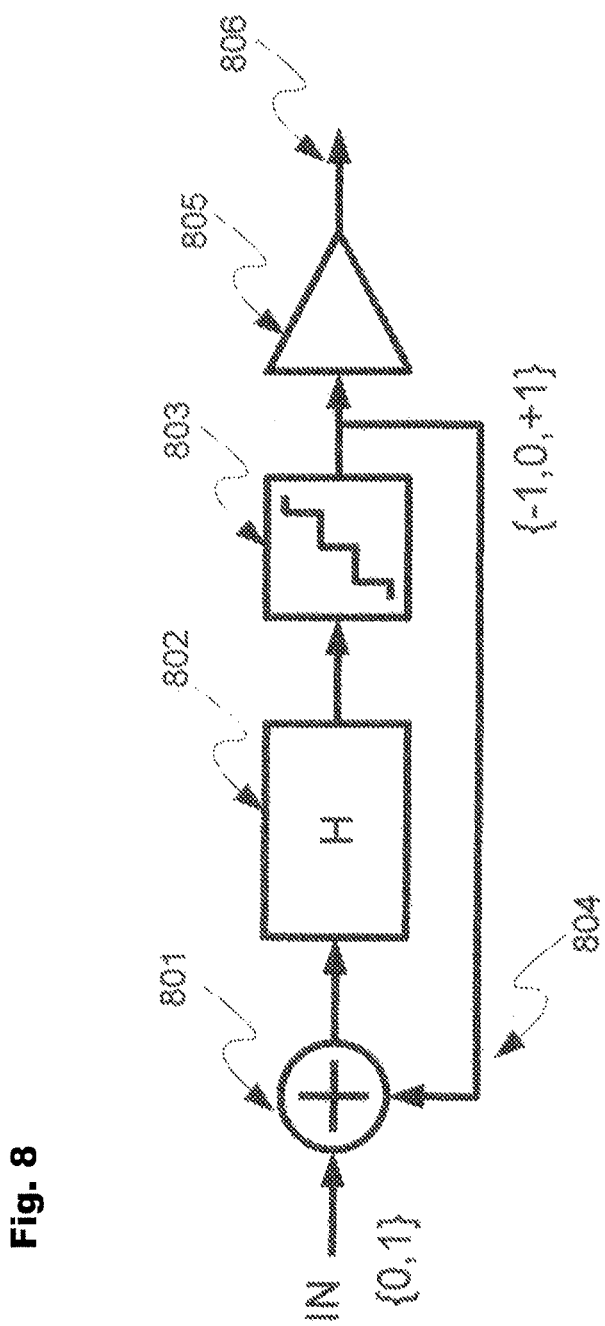
FIG. 8 is a structural diagram of a drive circuit of a digital sound system for driving a plurality of driving elements by the three values of 0, +1, and −1 in response to a digital selection signal of a third embodiment of the present invention.

FIG. 8 shows a third embodiment of the present invention. The present embodiment shows a circuit structure in the case where a circuit for converting a signal to a signal having the three values of 0, +1, and −1 is added in the case where a signal (IN) being input is a two-value signal of 1 or 0. An addition circuit (801), a loop filter (802) of a transfer function H, and a quantizer (803) for quantizing the output of the loop filter to 0, +1, and −1 are connected before a bridge connected drive circuit (805) for driving by the three values of 0, +1, and −1, and by feeding back a signal of 0, +1, and −1 from the quantizer to the addition circuit, a signal of 0, +1, and −1 is obtained from a two-value signal. In the case where an output of the quantizer (803) is 0, similarly to the first and second embodiments, a combination of signals for outputting 0 at the drive circuit (805) is output.

According to the third embodiment, by converting a two-value signal being input to a three-value using a loop filter and a quantizer it is possible to minimize a switching operation when representing 0 and to suppress an increase of current consumption when a signal is small. Since a linearity of the representation from −1 to +1 of a two-value signal being input is guaranteed, it is easy to maintain the linearity even for a drive signal converted to a three-value and it is possible to adjust the frequencies of −1, 0, and +1 using the transfer function of the loop filter. Even if the characteristics of a drive transistor being driven by the two drive signals (A/A) of a drive circuit are different in the case where drive signals (A and /A) transitions from 0 to 1, and in the case where the drive signals (A and /A) transitions from 1 to 0, variation of the current flowing to the coil being driven can be homogenized and it is also possible to uniformly adjust the two types of combinations of {0, 0} and {1, 1} of a drive signal in the case where a signal (IN) being input is 0, thereby any variation in transition from a state (+1 or −1) where current is flown to a coil to a state where a current is not flown to a coil is also homogenized.

Figure 9:
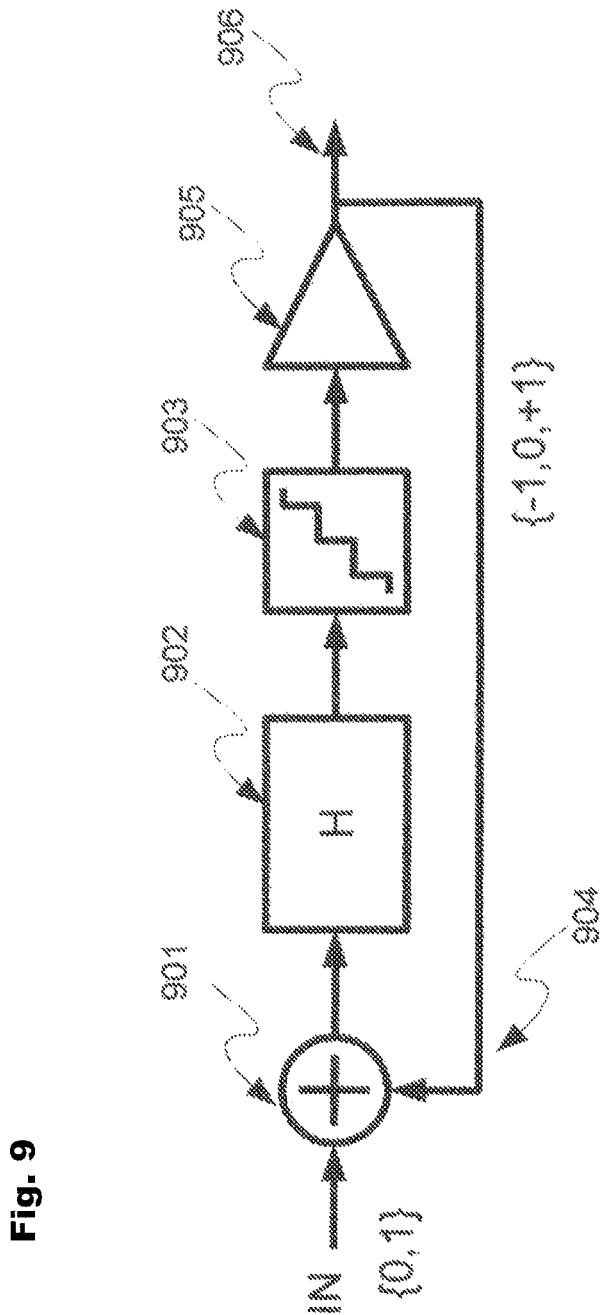
FIG. 9 is a structural diagram of a drive circuit of a digital sound system for driving a plurality of driving elements by the three values of 0, +1, and −1 in response to a digital selection signal of a fourth embodiment of the present invention.

FIG. 9 shows a fourth embodiment of the present invention. The present embodiment shows a circuit structure in the case where a circuit for converting a signal to a signal having the three values of +1, 0, and −1 is added in the case where a signal (IN) being input is a two-value signal of 1 and 0. An addition circuit (901), a loop filter (902) of a transfer function H, and a quantizer (903) for quantizing the output of the loop filter to 0, +1, and −1 are connected before a drive circuit (905), which is bridge connected, for driving by the three values of 0, +1, and −1, and by feeding back a 0 +1 and −1 signal from the drive circuit (905) connected to the quantizer to the addition circuit, a signal of 0, +1, and −1 is obtained from a two-value signal. In the case where an output of the quantizer (903) is 0, similarly to the first and second embodiments, a combination of signals for outputting 0 at the drive circuit (905) is output.

In the fourth embodiment, the output of the drive circuit (905) is returned to the integrator. By adopting this configuration, errors between an output signal converted to three-values and an input signal of −1 and +1 are reduced including a timing error caused by variations in transistor characteristics of the drive circuit (905) and the effects of variation of the current flowing.

Figure 10:
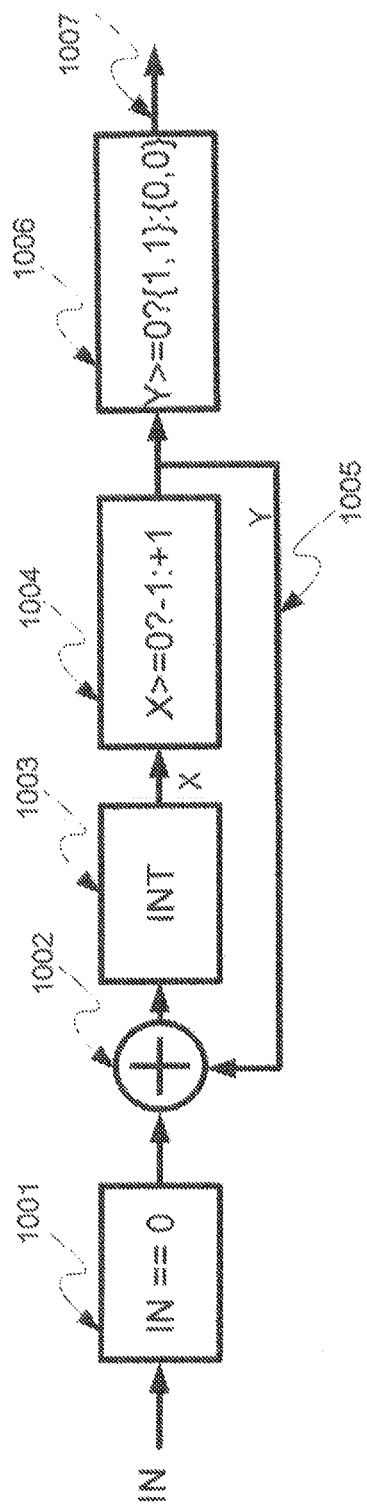
FIG. 10 is a structural diagram of a drive circuit of a digital sound system for driving a plurality of driving elements by the three values of 0, +1, and −1 in response to a digital selection signal of a fifth embodiment of the present invention.

FIG. 10 shows a fifth embodiment of the present invention. FIG. 10 shows a circuit structure of a circuit of the present embodiment for converting a signal to a drive signal of {1, 1} or {0, 0} as an output when the input signal (IN) is a signal of 0. This circuit includes a detection circuit (1001) for detecting 0 of an input signal, an addition circuit (1002), and an integrator circuit for (1003) integrating an output signal from the addition circuit (1002), a quantize (1004) for quantizing the output (X) of the integrator circuit to −1 or +1 is connected, and an output (Y) of the quantizer (1004) is fedback (1005) to the addition circuit (1002). In addition, the present embodiment is configured by a drive circuit (1006) for outputting {0, 0} or {1, 1} as a drive signal (1007) according to a sign of the output of the quantizer (1004). However, the feedback operation and integration operation operates only when the input from the detection circuit is detected as a value of 0.

In the fifth embodiment, the output of the quantizer (1004) is returned to the addition circuit (1002). By adopting this type of structure, the feedback is controlled so that the frequency with which the drive signal when the signal being input is 0 becomes {0 ,0} or {1, 1} is the same. In this way, even if the characteristics of a drive transistor being driven by the two drive signals (A and /A) of a drive circuit are different in the case where the drive signals (A and /A) transit from 0 to 1, and in the case where the drive signals (A and /A) transit from 1 to 0, variation of the current flowing to the coil being driven can be homogenized and it is also possible to uniformly adjust the two types of combinations {0, and 0} and {1, and 1} of a drive signal in the case where a signal (IN) being input is 0. Therefore, any variation in transition from a state (+1 or −1) where current is flown to a coil to a state where a current is not flown to a coil is also homogenized. At the same time, because a common-mode voltage of the drive signal when an input signal is 0 becomes constant, EMI radiation from a common-mode voltage and the generation of noise are also suppressed.

As described above, in the case of constructing a digital sound system comprised from of a plurality of coils driven by a plurality of digital signals generated from a digital sound signal, and particularly in the case of controlling using the three values of 0, +1, and −1 in response to a digital selection signal of a plurality of drive elements, by connecting an appropriate logic circuit before a drive circuit and mutually and uniformly using in time series two types of combinations of {0, 0} and {1, 1} as the two drive signals (A and /A) when an input signal is 0, from the problem of not being able to suppress variation between a three-value signal, it is possible to homogenize the variation between a three-value of 0, −1, and +1 signal caused by non-uniformity in the direction of the transition of the driver circuit. At the same time, because a common-mode voltage of the drive signal when an input signal is 0 becomes constant, EMI radiation from a common-mode voltage and the generation of noise are also suppressed.

One of effects of the present invention is as follows. That is, an effect of the present invention are produced in the case of constructing a digital sound system comprised from of a plurality of coils driven by a plurality of digital signals, and particularly in the case of controlling a plurality of elements by the three values of 0, +1, and −1 in response to a digital selection signal. In addition, it is also possible to obtain similar effects in the case of controlling a plurality of actuators or coils and a plurality of driving elements by the three values of 0, +1, and −1 in response to a digital selection signal in applications other than a digital audio system.

According to the present invention, it is possible to suppress a variation in pulse widths between signals when driving a plurality of driving elements using the three values of 0, +1, and −1. In particular, it is possible to construct a digital sound system having a plurality of coils driven by a plurality of digital signals generated from a digital sound signal, and it is possible to suppress a variation in pulse widths between signals when driving a plurality of driving elements using the three values of 0, +1, and −1 in response to a digital selection signal. As a result, it is possible to reproduce high-quality sound with reduced noise while utilizing the low power consumption of the original digital sound system.

What is claimed is:

1. A drive circuit to which a three-value signal including a value representing 0 is input, and which outputs two two-value signals for driving two drive elements such that a difference between the values representing the two two-value signals corresponds to a value representing the three-value signal, which is input,
   the drive circuit is connected to a logic circuit being input the three-value signal and a memory storing a flag value of the first flag determined based on the three-value signal input to the logic circuit,
   the drive circuit determining a combination of the two two-value signals, which are output, according to the flag value of the first flag stored in the memory and a value of the three-value signal, which is input to the logic circuit, in the case where the value of the three-value signal represents 0.

2. The drive circuit according to claim 1, further comprising the memory, wherein the flag value is inverted according to an input history of the three-value signal, and the combination of the two two-value signal being determined according to the flag value.

3. The drive circuit according to claim 2, wherein the flag value is inverted when the three-value signal currently input has a value not representing 0 and the three-value signal previously input has a value representing 0.

4. The drive circuit according to claim 1, further comprising the memory further configured to store a flag value of a second flag, wherein
   the flag value of the first flag being inverted when a three-value signal having a value except 0 is input after a three-value signal having a value representing 0 is input,
   the flag value of the second flag being inverted when the first flag is inverted, and
   the drive circuit determining the combination of the two two-value signal according to the combination of the first and second flag.

5. The drive circuit according to claim 1, further comprising a counter configured to count a number of times in which one of combination of the two two-value signal is output when a three-value signal having a value except 0 is input, the drive circuit determining the combination of the two two-value signal according to a value of the counter.

6. An operation method of a drive circuit comprising:
   inputting a three-value signal including a value representing 0, and
   outputting two two-value signals for driving two drive elements such that a difference between the values representing the two two-value signals corresponds to a value representing the three-value signal,
   the drive circuit is connected to a logic circuit being input the three-value signal and a memory storing a flag value of a first flag determined based on the three-value signal input to the logic circuit,
   the drive circuit determining a combination of the two two-value signals, which are output, according to the flag value of the first flag stored in the memory and a value of the three-value signal, which is input to the logic circuit, in the case where the value of the three-value signal represents 0.

* * * * *